(12) United States Patent
Huang

(10) Patent No.: US 12,029,093 B2
(45) Date of Patent: Jul. 2, 2024

(54) OLED DISPLAY PANEL WITH DIVERSE MANUFACTURING METHOD THEREOF

(71) Applicant: TCL CHINA STAR OPTOELECTRONICS TECHNOLOGY CO., LTD., Guangdong (CN)

(72) Inventor: Hui Huang, Guangdong (CN)

(73) Assignee: TCL CHINA STAR OPTOELECTRONICS TECHNOLOGY CO., LTD., Guangdong (CN)

( * ) Notice: Subject to any disclaimer, the term of this patent is extended or adjusted under 35 U.S.C. 154(b) by 823 days.

(21) Appl. No.: 17/055,585

(22) PCT Filed: Aug. 4, 2020

(86) PCT No.: PCT/CN2020/106738
§ 371 (c)(1),
(2) Date: Nov. 15, 2020

(87) PCT Pub. No.: WO2022/000696
PCT Pub. Date: Jan. 6, 2022

(65) Prior Publication Data
US 2022/0199689 A1 Jun. 23, 2022

(30) Foreign Application Priority Data
Jul. 2, 2020 (CN) .......................... 202010626632.4

(51) Int. Cl.
*H10K 59/38* (2023.01)
*H10K 50/82* (2023.01)
*H10K 71/00* (2023.01)

(52) U.S. Cl.
CPC ............ *H10K 59/38* (2023.02); *H10K 50/82* (2023.02); *H10K 71/00* (2023.02)

(58) Field of Classification Search
CPC .......... H10K 59/00–80524; H10K 59/875–95
See application file for complete search history.

(56) References Cited

U.S. PATENT DOCUMENTS 10,475,858 B2    11/2019   Wolk et al.
2004/0113875 A1*  6/2004   Miller ................. G09G 3/3216
                                                     345/82

(Continued)

FOREIGN PATENT DOCUMENTS

CN    1639883  A   7/2005
CN    106104841 A  11/2016
CN    110047889 A   7/2019

*Primary Examiner* — Didarul A Mazumder
*Assistant Examiner* — Gustavo G Ramallo
(74) *Attorney, Agent, or Firm* — PV IP PC; Wei Te Chung; Zhigang Ma

(57) ABSTRACT

An organic light-emitting diode (OLED) display panel and a manufacturing method thereof are provided. The OLED display panel includes an optical filter layer and a light-emitting layer stacked and disposed along a first direction. The optical filter layer includes a substrate, a first capping layer, and a color filter are sequentially stacked along the first direction. The light-emitting layer includes a second capping layer, a first electrode, a light-emitting functional layer, a hole transport layer, and a second electrode are sequentially stacked along the first direction. Thus, the light loss inside the OLED display panel can be reduced, and the light extraction efficiency can be improved.

16 Claims, 2 Drawing Sheets

(56) References Cited

U.S. PATENT DOCUMENTS

| | | | |
|---|---|---|---|
| 2004/0166362 A1* | 8/2004 | Utsumi | H10K 50/85 |
| | | | 428/917 |
| 2005/0253505 A1 | 11/2005 | Braak et al. | |
| 2006/0220008 A1* | 10/2006 | Ko | H10K 50/852 |
| | | | 257/40 |
| 2008/0159083 A1* | 7/2008 | Kawakami | G04B 19/12 |
| | | | 368/232 |
| 2010/0187513 A1* | 7/2010 | Okumoto | H10K 50/171 |
| | | | 257/40 |
| 2011/0169019 A1* | 7/2011 | Chen | G02F 1/167 |
| | | | 438/34 |
| 2012/0267660 A1* | 10/2012 | Han | H10K 50/841 |
| | | | 257/E51.001 |
| 2013/0001578 A1* | 1/2013 | Song | H01L 29/4908 |
| | | | 257/E27.12 |
| 2016/0343971 A1* | 11/2016 | Dechand | H10K 71/00 |
| 2017/0084669 A1 | 3/2017 | Wolk et al. | |
| 2018/0190929 A1* | 7/2018 | Koch | H10K 50/171 |
| 2019/0131350 A1* | 5/2019 | Kwak | H10K 59/35 |
| 2019/0229153 A1 | 7/2019 | Park et al. | |
| 2021/0109400 A1* | 4/2021 | Kim | H01L 33/04 |
| 2021/0159458 A1* | 5/2021 | Cho | H10K 59/353 |
| 2021/0167300 A1* | 6/2021 | Choi | C07D 493/04 |

* cited by examiner

OLED DISPLAY PANEL WITH DIVERSE MANUFACTURING METHOD THEREOF

FIELD DISCLOSURE

The present disclosure relates to the technical field of displays, and in particular to an organic light-emitting diode (OLED) display panel and a manufacturing method thereof.

BACKGROUND OF DISCLOSURE

Currently, the luminous efficiency of organic light-emitting diode (OLED) devices is low, and when a white organic light-emitting diode (WOLED) is being prepared, it is required to undergo an optical filtering process by color filters, so as to obtain a desirable luminous chromaticity.

Moreover, due to a refractive index of an interface, a total internal reflection occurs during luminescence, most of light refracts or reflects inside the OLED display device, and the light cannot be effectively extracted, which causes serious light loss. At present, the most commonly used method of light extraction is to improve the inside of the device and the side of a glass substrate, or directly add corresponding light extraction device outside. However, this method has difficulty in implement. Some of the methods of light extraction are to manufacture a capping layer (CPL) on a cathode of a light-emitting layer, so that a refractive index between the light-emitting layer and the glass substrate is changed, the efficiency of the total internal reflection is reduced, and more light can be emitted to the air. However, the disadvantage of this method is that the capping layer only can be manufactured by evaporation, and when the color filter is used as a cover plate, the light emitted from the glass substrate is filtered by the color filter for further emission, which reduces the effect of the capping layer.

Therefore, in the existing OLED display panel technique, there are some problems existing in the OLED display panel. For example, the total internal reflection occurs during luminescence, there is serious light loss, and adding a light extraction device is difficult, the capping layer disposed on the light-emitting layer only can be manufactured by the evaporation, and the optical coupling effect is reduced after the light passing through the color filter. Thus, it is urgent to improve the problems above.

SUMMARY OF INVENTION

Technical Problems

The present disclosure relates to an organic light-emitting diode (OLED) display panel and a manufacturing method thereof, which may solve the problems that the total internal reflection occurs in the OLED display panel during luminescence, there is serious light loss, and adding a light extraction device is difficult, the capping layer disposed on the light-emitting layer only can be manufactured by the evaporation, and the optical coupling effect is reduced after the light passes through the color filter.

Technical Solutions

In order to solve the problems above, the technical solutions provided in the present disclosure are described below.

An organic light-emitting diode (OLED) display panel is provided in the present disclosure. The OLED display panel includes: an optical filter layer and a light-emitting layer stacked along a first direction.

The optical filter layer includes a substrate, a first capping layer, and a color filter sequentially stacked along the first direction.

The light-emitting layer includes a second capping layer, a first electrode, a light-emitting functional layer, a hole transport layer, and a second electrode sequentially stacked along the first direction.

A thickness of the hole transport layer is 24-200 nm.

According to an embodiment of the present disclosure, a refractive index of the first capping layer is the same as a refractive index of the second capping layer, and the refractive index of the first capping layer is less than a refractive index of the color filter and greater than a refractive index of the substrate.

According to an embodiment of the present disclosure, a refractive index of the first capping layer and a refractive index of the second capping layer both decrease in a light extraction direction along the first direction.

According to an embodiment of the present disclosure, a thickness of the first capping layer is the same as a thickness of the second capping layer along the first direction, and both of the first capping layer and the second capping layer along the first direction have a preset thickness.

According to an embodiment of the present disclosure, the preset thicknesses of each of the first capping layer and the second capping layer along the first direction is 15-200 nm.

According to an embodiment of the present disclosure, the thickness of the first capping layer is in inverse proportion to a refractive index of the first capping layer, and the thickness of the second capping layer is in inverse proportion to a refractive index of the second capping layer.

According to an embodiment of the present disclosure, a material of the first capping layer and the second capping layer is an organic material including triphenylamine.

According to an embodiment of the present disclosure, the first electrode is a cathode layer, and the second electrode is an anode layer.

According to an embodiment of the present disclosure, a material of the cathode layer is one of ytterbium (Yb), calcium (Ca), magnesium (Mg), and silver (Ag) or a combination thereof, and a material of the hole transport layer 24 is one of 2TNATA, NPB, and TAPC or a combination thereof.

According to an embodiment of the present disclosure, the light-emitting functional layer includes a red light-emitting unit, a green light-emitting unit, a blue light-emitting unit, and a white light-emitting unit.

According to an embodiment of the present disclosure, the light-emitting functional layer has a preset thickness along the first direction, and the preset thickness of the light-emitting functional layer is 10-80 nm.

An OLED display panel is further provided in the present disclosure. The OLED display panel includes: an optical filter layer and a light-emitting layer stacked along a first direction.

The optical filter layer includes a substrate, a first capping layer, and a color filter sequentially stacked along the first direction.

The light-emitting layer includes a second capping layer, a first electrode, a light-emitting functional layer, a hole transport layer, and a second electrode sequentially stacked along the first direction.

According to an embodiment of the present disclosure, a refractive index of the first capping layer is the same as a refractive index of the second capping layer, and the refractive index of the first capping layer is less than a refractive index of the color filter and greater than a refractive index of the substrate.

According to an embodiment of the present disclosure, a refractive index of the first capping layer and a refractive index of the second capping layer both decrease in a light extraction direction along the first direction.

According to an embodiment of the present disclosure, a thickness of the first capping layer is the same as a thickness of the second capping layer along the first direction, and both of the first capping layer and the second capping layer along the first direction have a preset thickness.

According to an embodiment of the present disclosure, the preset thicknesses of each of the first capping layer and the second capping layer along the first direction is 15-200 nm.

According to an embodiment of the present disclosure, the thickness of the first capping layer is in inverse proportion to a refractive index of the first capping layer, and the thickness of the second capping layer is in inverse proportion to a refractive index of the second capping layer.

According to an embodiment of the present disclosure, a material of the first capping layer and the second capping layer is an organic material including triphenylamine.

According to an embodiment of the present disclosure, the first electrode is a cathode layer, and the second electrode is an anode layer.

A manufacturing method for the OLED display panel as described above is provided in the present disclosure. The manufacturing method includes:

a step S10 of providing a substrate; and a step S20 of sequentially depositing a first capping layer, a color filter, a second capping layer, a first electrode, a light-emitting functional layer, a hole transport layer, and a second electrode on a side surface of the substrate, wherein a thickness of the first capping layer is the same as a thickness of the second capping layer.

According to an embodiment of the present disclosure, the first capping layer and the second capping layer are manufactured by evaporation, coating, or printing.

Beneficial Effects

Compared with the existing technique, the beneficial effects of the OLED display panel and the manufacturing method thereof provided in the present disclosure are as below.

The OLED display panel is provided in the present disclosure. The OLED display panel includes: an optical filter layer and a light-emitting layer stacked along a first direction. The optical filter layer includes a substrate, a first capping layer, and a color filter sequentially stacked along the first direction. The light-emitting layer includes a second capping layer, a first electrode, a light-emitting functional layer, a hole transport layer, and a second electrode sequentially stacked along the first direction. The first capping layer is disposed in the optical filter layer, and the second capping layer is disposed in the light-emitting layer, so that the light loss inside the OLED display panel is reduced, and light extraction efficiency of the OLED display panel is increased.

In the manufacturing method for the OLED display panel provided in the present disclosure, the first capping layer and the second capping layer are not limited to be manufactured by evaporation but can be manufactured by coating or printing. The manufacturing methods are diverse, which is advantageous for commercial production.

BRIEF DESCRIPTION OF DRAWINGS

In order to clearly illustrate the technical solutions in the embodiments of the present disclosure, the drawings used in the description of the embodiments will be briefly introduced below. Obviously, the drawings in the following description are only some embodiments of the disclosure. Other drawings can also be obtained from those skilled in the art based on these drawings without paying any inventive effort.

DETAILED DESCRIPTION OF EMBODIMENTS

Figure 1:
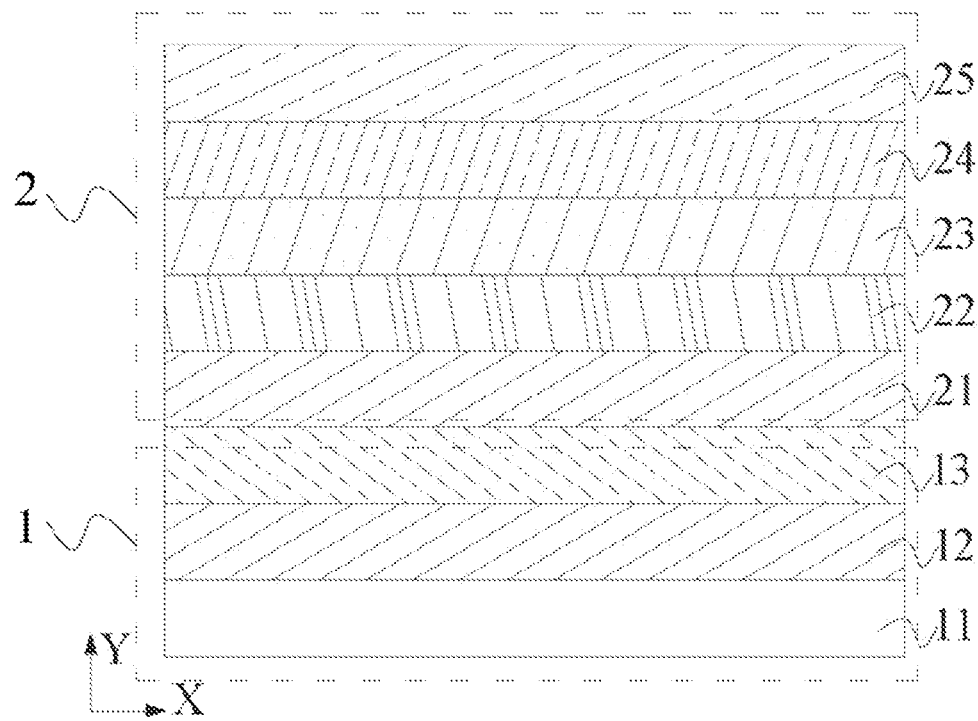
FIG. 1 is a schematic view of a structure of an organic light-emitting diode (OLED) display panel provided by an embodiment of the present disclosure.

The technical solutions in the embodiments of the present disclosure are clearly and completely described in the following description, which is combined with the drawings in the embodiments of the present disclosure. Obviously, the embodiments described in the following description are only a part of the embodiments of the disclosure, not all the embodiments. Other embodiments obtained from those skilled in the art based on the embodiments of the present disclosure without paying any inventive effort belong to a protected scope of the present disclosure.

It is realized that the direction and position relationship indicated by the terms, such as "central", "longitudinal", "transversal", "lengths", "width", "thickness", "upper", "lower", "front", "post", "left", "right", "vertical", "horizontal", "top", "down", "inside", "outside", "clockwise", and "counterclockwise", are direction and position relationship based on the drawings of this disclosure. The terms only facilitate describing the present disclosure and simplifying the description, not indicate or imply that the devices or elements must have a specific direction, be configured, and operated in a specific direction. Therefore, the terms should not be realized to limit the present invention. Moreover, the terms "first" and "second" are used for descriptive purposes only, and cannot be realized as indicating or implying relative importance or implying the number of indicated technical features. Thus, the technical features defined as "first" and "second" may explicitly or implicitly include one or more of the technical features. In the description of the present disclosure, a meaning of "a plurality of" is two or more, unless specifically defined.

An organic light-emitting diode (OLED) display panel and a manufacturing method thereof are provided in the present disclosure. Please specifically refer to FIGS. 1-3.

In the existing OLED display panel, due to a refractive index of an interface, a total internal reflection occurs during luminescence, most of light refracts or reflects inside the OLED display panel, and the light cannot be effectively extracted, which causes serious light loss. At present, the most commonly used method of light extraction is to improve the inside of the device and the side of a glass substrate, or directly add corresponding light extraction device outside. However, this method has difficulty in implement. Some of the methods of light extraction are to manufacture a capping layer on a cathode of a light-emitting layer, so that a refractive index between the light-emitting layer and the glass substrate is changed, the effect of the total internal reflection is reduced, and more light can be emitted to the air. However, the disadvantage of this method is that the capping layer only can be manufactured by the evaporation, and when the color filter is used as a cover plate, the light emitted from the glass substrate is filtered by the color filter for further emission, which reduces the effect of the capping layer. Therefore, an OLED display panel and a manufacturing method thereof are provided in the present disclosure, so as to solve the problems above.

Refer to FIG. 1, which is a schematic view of a structure of the OLED display panel provided by an embodiment of the present disclosure. The OLED display panel is provided in the present disclosure. The OLED display panel includes: an optical filter layer 1 and a light-emitting layer 2 stacked along a first direction Y. The optical filter layer 1 includes a substrate 11, a first capping layer 12, and a color filter 13 sequentially stacked along the first direction Y. The light-emitting layer 2 includes a second capping layer 21, a first electrode 22, a light-emitting functional layer 23, a hole transport layer 24, and a second electrode 25 sequentially stacked along the first direction Y. That is, the first capping layer 12 is disposed in the optical filter layer 1, the second capping layer 21 is disposed in the light-emitting layer 2, and the first capping layer 12 is disposed opposite the second capping layer 21, so that the total internal reflection occurred in the OLED display panel is reduced, and the light loss in the OLED display panel is reduced.

In some embodiments of the present disclosure, a refractive index of the first capping layer 12 is the same as a refractive index of the second capping layer 21, and the refractive index of the first capping layer 12 is less than a refractive index of the color filter 13 and greater than a refractive index of the substrate 11.

Further, a refractive index of the first capping layer 12 and a refractive index of the second capping layer 21 both decrease in a light extraction direction along the first direction Y (That is, a side of the first capping layer 12 away from the substrate 11 or a side of the second capping layer 21 away from the substrate 11). The refractive index is a value calculated from the ratio of the speed of light in two mediums (isotropy). Because the light is an electromagnetic wave, the electrons are forced to vibrate when an electromagnetic field propagates in space and passes through a substance, and the electrons also emit the electromagnetic wave during vibration. This light has a certain phase delay relative to the original light. In other words, the propagation speed generally slows down, and in rare cases, the propagation speed speeds up. The addition of the capping layer with a high refractive index can improve the reflectivity of the first electrode 22 to the light, which means the light emitted to the first electrode 22 and then reflected into a microcavity increases. (The microcavity is formed by a plurality of films of the OLED display panel. In the present embodiment, the microcavity includes the substrate 11, the first capping layer 12, and the color filter layer 13. The light is limited in a small wavelength region by the reflection, total internal reflection, interference, diffraction, scattering, etc. of the light on an interface with a discontinuous refractive index.) In this way, the light totally internally reflected from the substrate 11 to the microcavity, the light half reflected from the first electrode 22 to the microcavity, and the light emitted and reflected from different angles and positions undergo interference in the microcavity. By defining the microcavity with a certain length, the light in certain wavelength regions may be selectively enhanced, and the light in the other wavelength regions may be weakened, so that the optical coupling effect is improved. Due to the interference of light in the microcavity, the greater the refractive index of the capping layer is, the greater the reflectivity of the light in the interaction with the first electrode 22 is. The better the effect of light interference enhancement in the microcavity is, the better the effect of light extraction in the OLED display is. Therefore, the external quantum efficiency of the OLED device is greatly improved, the working luminance of the OLED display is improved, and the driving current and power loss of OLED display are reduced, so that the service lifespan of the OLED display is greatly extended. Moreover, the manufacturing method of the second capping layer 21 is not limited to common evaporation methods since the second capping layer 21 is disposed below the first electrode 22 along the first direction Y. The second capping layer 21 can be manufactured by coating or printing, so that the manufacturing process is diverse and is convenient for commercial production.

Based on the Snell's Law, a first medium X1 with refractive index n1 (such as substrate), and a second medium X2 with refractive index n2 (such as the first capping layer or the color filter) satisfy n1>n2 and n1/n2=sin β/sin θ, wherein θ is an angle of incidence, and β is an angle of emergence. The critical condition in which the light can refract is that β is equal to 90 degrees. That is, a critical degree in which the light can refract is that θ=arcsin(n2/n1). When the angle of incidence θ is greater than arcsin(n2/n1), the total internal reflection will occur. The total internal reflection refers to the phenomenon that the light completely reflects back into the original medium when the light is emitted from an optically denser medium (i.e. the refractive index of the light in this medium is high) to a interface of a second medium (i.e. the refractive index of the light in this medium is low). Therefore, when the light is emitted from the substrate to the first capping layer and then emitted into the color filter (the refractive index of the substrate is less than the refractive index of the first capping layer, and the refractive index of the first capping layer is less than the refractive index of the color filter), the total internal reflection will not occur. When the angle of incidence of the light θ<arcsin(n2/n1) and β=arcsin (n1/n2*sin θ), the greater the refractive index n2 of the second medium is, the lesser the angle of emergence β is, the stronger the light-gathering ability is, and the better the light extraction effect is.

Figure 2:
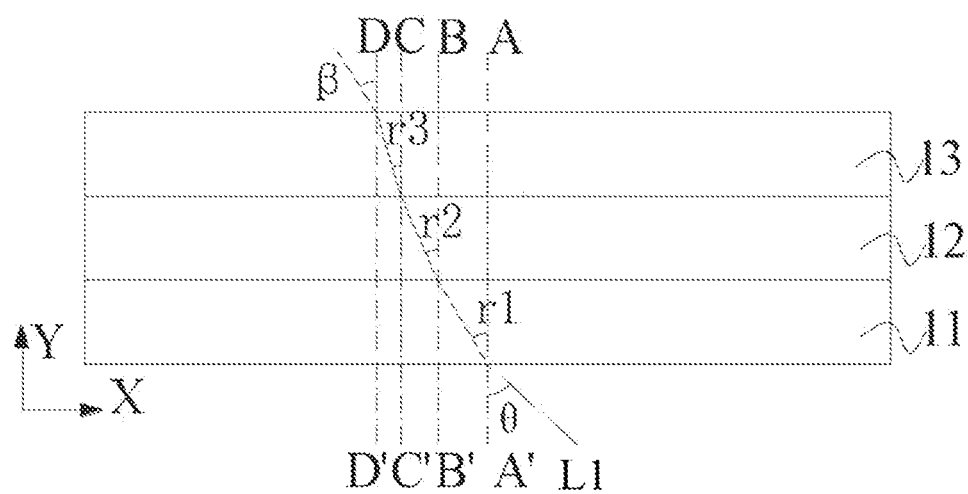
FIG. 2 is a schematic view of a structure of an optical filter layer provided by an embodiment of the present disclosure when the light is emitted into the optical filter layer.

Refer to FIG. 2. When the light is emitted from the external air into the substrate 11, the angle between the incident light and normal AA' is an angle of incidence θ. When the light enters the substrate 11, the angle between the light and the normal AA' is a first refraction angle r1. After the light enters the first capping layer 12, the angle between the light and the normal BB' is a second refraction angle r2. After the light enters the color filter 13, the angle between the light and the normal CC' is a third refraction angle r2. The angle between the light and the normal DD' is an angle of emergence β. A layer of the first capping layer is added, and the refractive index of the capping layer is less than a refractive index of the color filter and greater than a refractive index of the substrate. Therefore, when the second refraction angle r2 at which the light L1 enters the first capping layer from the substrate is less than a refraction angle r2' at which the light L1 enters the color filter from the substrate, the angle of light entering the color filter is less, and the angle of emergence β is less. More light can be emitted from one side of the color filter, so as to improve the light extraction efficiency of the OLED display panel.

In some embodiments of the present disclosure, a thickness of the first capping layer 12 is the same as a thickness of the second capping layer 21 along the first direction Y, and both of the first capping layer 12 and the second capping layer 21 are nano-structure which is a film morphology. Both of the first capping layer 12 and the second capping layer 21 along the first direction Y have a preset thickness. Further, the preset thickness of each of the first capping layer 12 and the second capping layer 21 along the first direction Y is 15-200 nm. A manufacturing method of the first capping layer 12 is the same as a manufacturing method of the second capping layer 21. The main function of the second capping layer 21 below the first electrode 22 (which is the second capping layer 21 in the optical filter layer 2) is to improve the light extraction efficiency, and change the directivity of the electrons in the first electrode 22, so that the electron coupled with a luminescent photon is changed and the possibility of the coupling is reduced.

In some embodiments of the present disclosure, the thickness of the first capping layer 12 or the second capping layer 21 is λ/4n, wherein the λ is a wavelength of the light emitted by the light-emitting functional layer 23, and n is a refractive index of the capping layer. Therefore, the thickness of the first capping layer 12 is in inverse proportion to a refractive index of the first capping layer 12, and the thickness of the second capping layer 21 is in inverse proportion to a refractive index of the second capping layer 21.

In some embodiments of the present disclosure, a material of the first capping layer 12 and the second capping layer 21 is an organic material including triphenylamine. Actually, the material of the first capping layer 12 may be the same as or different from a material of the hole transport layer 24. Mainly, triphenylamine needs to be included in the material of the first capping layer 12 and the second capping layer 21. The structure of the benzene has a certain influence on the thickness of the material, and the effect is adjusted by the thickness, so as to improve the light extraction efficiency.

In some embodiments of the present disclosure, the first electrode 22 is a cathode layer, and the second electrode 25 is an anode layer. The cathode layer is a half-reflection and half-transmission cathode. A material of the cathode layer is one of ytterbium (Yb), calcium (Ca), magnesium (Mg) or a combination thereof. A side of the cathode layer away from an electron injection layer is a light extraction side. The cathode layer is a translucent electrode material, which has a half-reflection effect to the light. The microcavity is formed between the second electrode layer 25 with half reflection and the substrate 11 with total internal reflection. The interference of the light is enhanced in the microcavity, and the microcavity is an optical microcavity, which refers to a micro resonant tank whose cavity size is as small as that of resonant light waves in at least one direction.

Further, the hole transport layer 24 is a material with high hole mobility, high heat stability, and the desirable blocking ability for electron and exciton. In some embodiments of the present disclosure, a material of the hole transport layer 24 is one or more of 2TNATA, NPB, and TAPC. A thickness of the hole transport layer 24 is 24-200 nm, and the hole transport layer 24 is deposited below the second electrode 25 by the vacuum evaporation.

Further, the light-emitting functional layer 23 includes a red light-emitting unit, a green light-emitting unit, a blue light-emitting unit, and a white light-emitting unit. In these light-emitting units in four colors, a wavelength of the red light emitted by the red light-emitting unit is the longest, a wavelength of the red light emitted by the blue light-emitting unit is the shortest, and a wavelength of the red light emitted by the green light-emitting unit and the white light-emitting unit is between the wavelength of the red light emitted by the red light-emitting unit and the wavelength of the red light emitted by the blue light-emitting unit. Further, the light-emitting functional layer 23 along the first direction Y has a preset thickness, and the preset thickness of the light-emitting functional layer 23 is 10-80 nm.

Figure 3:
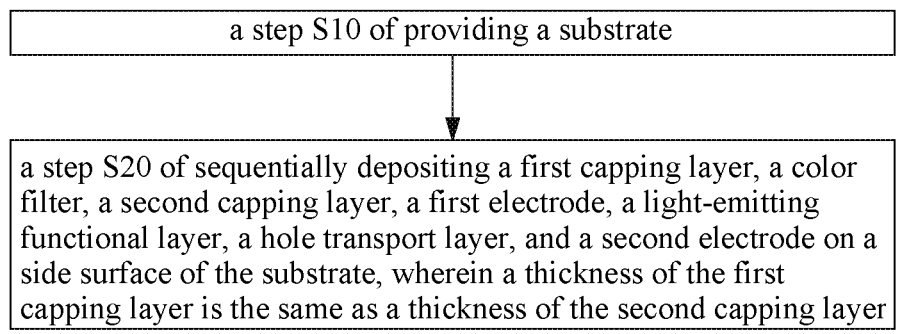
FIG. 3 is a schematic view of a process of a manufacturing method for the OLED display panel provided by an embodiment of the present disclosure.

Refer to FIG. 3, which is a schematic view of a process of a manufacturing method for the OLED display panel provided by an embodiment of the present disclosure. The manufacturing method for the OLED display panel as described above includes:

a step S10 of providing a substrate 11, wherein the substrate 11 is glass substrate or resin substrate; and a step S20 of sequentially depositing a first capping layer 12, a color filter 13, a second capping layer 21, a first electrode 22, a light-emitting functional layer 23, a hole transport layer 24, and a second electrode 25 on a side surface of the substrate 11, wherein a thickness of the first capping layer 12 is the same as a thickness of the second capping layer 21.

In some embodiments of the present disclosure, the first capping layer 12 and the second capping layer 21 are manufactured by evaporation, coating, or printing, not limited to common evaporation processes. The manufacturing methods are diverse, which is advantageous for commercial production.

Compared with the existing technique, the beneficial effects of the OLED display panel and a manufacturing method thereof provided in the present disclosure are as below. First, the OLED display panel is provided in the present disclosure. The OLED display panel includes: an optical filter layer 1 and a light-emitting layer 2 stacked along a first direction Y. The optical filter layer 1 includes a substrate 11, a first capping layer 12, and a color filter 13 sequentially stacked along the first direction Y. The light-emitting layer 2 includes a second capping layer 21, a first electrode 22, a light-emitting functional layer 23, a hole transport layer 24, and a second electrode 25 sequentially stacked along the first direction Y. The first capping layer 12 is disposed in the optical filter layer 1, and the second capping layer 21 is disposed in the light-emitting layer 2, so that the light loss inside the OLED display panel is reduced, and light extraction efficiency of the OLED display panel is increased. Second, a manufacturing method for the OLED display panel is provided in the present disclosure. The first capping layer 12 and the second capping layer 21 are not limited to be manufactured by evaporation but can be manufactured by coating or printing. The manufacturing methods are diverse, which is advantageous for commercial production.

The OLED display panel and the manufacturing method thereof provided by the embodiments of the present disclosure are described in detail as above. The principles and embodiments of the present disclosure are described in the specific examples. The description of the embodiments is only for helping understand the technical solutions and its core idea of the present disclosure. It should be understood by those skilled in the art that they can still modify the technical solutions described in the above embodiments or equivalently replace some of the technical features, and these modifications or replacements do not depart from the scope of the technical solutions of the embodiments of the present disclosure.

What is claimed is:

1. An organic light-emitting diode (OLED) display panel, comprising:
    an optical filter layer and a light-emitting layer stacked along a first direction;
    wherein the optical filter layer includes a substrate, a first capping layer, and a color filter sequentially stacked in a light extraction direction along the first direction;
    wherein the light-emitting layer includes a second capping layer, a first electrode, a light-emitting functional layer, a hole transport layer, and a second electrode sequentially stacked in the light extraction direction along the first direction;
    wherein a thickness of the hole transport layer is 24-200 nm;
    wherein a refractive index of the first capping layer and a refractive index of the second capping layer both decrease in the light extraction direction along the first direction, and the refractive index of the first capping layer is less than a refractive index of the color filter and greater than a refractive index of the substrate;
    wherein the light extraction direction is a direction from a side of the first capping layer away from the substrate.

2. The OLED display panel as claimed in claim 1, wherein a thickness of the first capping layer is the same as a thickness of the second capping layer along the first direction, and both of the first capping layer and the second capping layer along the first direction have a preset thickness.

3. The OLED display panel as claimed in claim 2, wherein the preset thickness of each of the first capping layer and the second capping layer along the first direction is 15-200 nm.

4. The OLED display panel as claimed in claim 2, wherein the thickness of the first capping layer is in inverse proportion to a refractive index of the first capping layer, and the thickness of the second capping layer is in inverse proportion to a refractive index of the second capping layer.

5. The OLED display panel as claimed in claim 1, wherein a material of the first capping layer and the second capping layer is an organic material comprising triphenylamine.

6. The OLED display panel as claimed in claim 1, wherein the first electrode is a cathode layer, and the second electrode is an anode layer.

7. The OLED display panel as claimed in claim 6, wherein a material of the cathode layer is one of ytterbium (Yb), calcium (Ca), magnesium (Mg), and silver (Ag) or a combination thereof, and a material of the hole transport layer is one of 2TNATA, NPB, and TAPC or a combination thereof.

8. The OLED display panel as claimed in claim 1, wherein the light-emitting functional layer comprises a red light-emitting unit, a green light-emitting unit, a blue light-emitting unit, and a white light-emitting unit.

9. The OLED display panel as claimed in claim 1, wherein the light-emitting functional layer has a preset thickness along the first direction, and the preset thickness of the light-emitting functional layer is 10-80 nm.

10. A manufacturing method for an organic light-emitting diode display panel as claimed in claim 1, the manufacturing method comprising:
    a step S10 of providing a substrate; and
    a step S20 of sequentially depositing a first capping layer, a color filter, a second capping layer, a first electrode, a light-emitting functional layer, a hole transport layer, and a second electrode on a side surface of the substrate, wherein a thickness of the first capping layer is the same as a thickness of the second capping layer.

11. The manufacturing method for the OLED display panel as claimed in claim 10, wherein the first capping layer and the second capping layer are manufactured by evaporation, coating, or printing.

12. An organic light-emitting diode (OLED) display panel, comprising:
    an optical filter layer and a light-emitting layer stacked and disposed along a first direction;
        wherein the optical filter layer includes a substrate, a first capping layer, and a color filter sequentially stacked in a light extraction direction along the first direction; and
        wherein the light-emitting layer includes a second capping layer, a first electrode, a light-emitting functional layer, a hole transport layer, and a second electrode sequentially stacked in the light extraction direction along the first direction;
        wherein the refractive index of the first capping layer and a refractive index of the second capping layer both decrease in the light extraction direction along the first direction, and the refractive index of the first capping layer is less than a refractive index of the color filter and greater than a refractive index of the substrate;
        wherein the light extraction direction is a direction from a side of the first capping layer away from the substrate.

13. The OLED display panel as claimed in claim 12, wherein a thickness of the first capping layer is the same as a thickness of the second capping layer along the first direction, and both of the first capping layer and the second capping layer along the first direction have a preset thickness.

14. The OLED display panel as claimed in claim 13, wherein the preset thickness of each of the first capping layer and the second capping layer along the first direction is 15-200 nm.

15. The OLED display panel as claimed in claim 13, wherein the thickness of the first capping layer is in inverse proportion to a refractive index of the first capping layer, and the thickness of the second capping layer is in inverse proportion to a refractive index of the second capping layer.

16. The OLED display panel as claimed in claim 12, wherein a material of the first capping layer and the second capping layer is an organic material comprising triphenylamine.

* * * * *